US012368222B2

(12) United States Patent
Cheng et al.

(10) Patent No.: US 12,368,222 B2
(45) Date of Patent: Jul. 22, 2025

(54) ELECTRONIC DEVICE COMPRISING FIRST AND SECOND METAL PATTERNS ARRANGED WITH FIRST AND SECOND INSULATING PATTERNS IN A SPECIFIED CONFIGURATION

(71) Applicant: Innolux Corporation, Miaoli County (TW)

(72) Inventors: Chung-Chun Cheng, Miaoli County (TW); Chia-Chi Ho, Miaoli County (TW); Chia-Ping Tseng, Miaoli County (TW); Yan-Zheng Wu, Miaoli County (TW); Yao-Wen Hsu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 157 days.

(21) Appl. No.: 17/975,566

(22) Filed: Oct. 27, 2022

(65) Prior Publication Data

US 2023/0170603 A1 Jun. 1, 2023

Related U.S. Application Data

(60) Provisional application No. 63/283,298, filed on Nov. 26, 2021.

(30) Foreign Application Priority Data

Aug. 5, 2022 (CN) .......................... 202210937934.2

(51) Int. Cl.
*H01P 3/08* (2006.01)
*H01P 3/18* (2006.01)
(Continued)

(52) U.S. Cl.
CPC .............. *H01P 3/082* (2013.01); *H01P 3/088* (2013.01); *H01P 3/18* (2013.01); *H01P 5/028* (2013.01); *H01Q 1/2283* (2013.01); *H01Q 1/38* (2013.01)

(58) Field of Classification Search
CPC ................................ H01P 3/082; H01P 5/028
(Continued)

(56) References Cited

U.S. PATENT DOCUMENTS 5,160,904 A * 11/1992 Babbitt et al. .......... H01P 5/028
333/34
2004/0164819 A1 8/2004 Mishima et al.
(Continued)

FOREIGN PATENT DOCUMENTS

TW 202023011 6/2020

OTHER PUBLICATIONS

"Search Report of Europe Counterpart Application", issued on Apr. 25, 2023, p. 1-p. 10.
(Continued)

*Primary Examiner* — Benny T Lee
(74) *Attorney, Agent, or Firm* — JCIPRNET

(57) ABSTRACT

An electronic device including a substrate, a first metal pattern, a first insulating pattern, and a second metal pattern is provided. The first metal pattern is disposed on the substrate. The first insulating pattern is disposed on the first metal pattern. The second metal pattern is disposed on the first metal pattern and the first insulating pattern. The second metal pattern includes a first contact portion and a second contact portion. In a cross-sectional view, the first contact portion and the second contact portion are in contact with the first metal pattern, and the first insulating pattern is in
(Continued)

contact with the first metal pattern and the second metal pattern between the first contact portion and the second contact portion.

19 Claims, 13 Drawing Sheets

(51) Int. Cl.
*H01P 5/02* (2006.01)
*H01Q 1/22* (2006.01)
*H01Q 1/38* (2006.01)

(58) Field of Classification Search
USPC .................................................. 333/238, 246
See application file for complete search history.

(56) References Cited

U.S. PATENT DOCUMENTS

2009/0309679 A1* 12/2009 Kikuchi et al. ......... H01P 5/028
   174/260
2018/0138594 A1   5/2018 Orui et al.
2018/0301806 A1  10/2018 Orui et al.

OTHER PUBLICATIONS

"Office Action of Taiwan Counterpart Application", issued on May 11, 2023, p. 1-p. 5.

* cited by examiner

ELECTRONIC DEVICE COMPRISING FIRST AND SECOND METAL PATTERNS ARRANGED WITH FIRST AND SECOND INSULATING PATTERNS IN A SPECIFIED CONFIGURATION

CROSS-REFERENCE TO RELATED APPLICATION

This application claims the priority benefits of U.S. application Ser. No. 63/283,298, filed on Nov. 26, 2021 and Chinese application no. 202210937934.2, filed on Aug. 5, 2022. The entirety of each of the above-mentioned patent applications is hereby incorporated by reference herein and made a part of this specification.

BACKGROUND

Technical Field

The disclosure relates to an electronic device. In particular, the disclosure relates to an antenna device.

Description of Related Art

A metal layer and a substrate for forming an electronic device include different materials and different physical properties (e.g., thermal expansion coefficients). Therefore, warpage generated in the substrate during a process of manufacturing the electronic device such as a sputtering process or a high temperature process. The warpage of the substrate is likely to cause abnormal signal transmission in the electronic device and reduce reliability of the electronic device. The warpage issue of the substrate is increasingly obvious as a thickness of the metal layer increases. Although increasing the thickness of the substrate can reduce the warpage caused, a subsequent process of thinning the thickened substrate is still required, thus increasing the process cost.

SUMMARY OF THE INVENTION

The disclosure provides an electronic device that reduces substrate warpage and improves reliability.

According to some embodiments of the disclosure, an electronic device includes a substrate, a first metal pattern, a first insulating pattern, and a second metal pattern. The first metal pattern is disposed on the substrate. The first insulating pattern is disposed on the first metal pattern. The second metal pattern is disposed on the first metal pattern and the first insulating pattern. The second metal pattern includes a first contact portion and a second contact portion. The first contact portion and the second contact portion are in contact with the first metal pattern. The first insulating pattern is in contact with the first metal pattern and the second metal pattern between the first contact portion and the second contact portion in a cross-sectional view.

According to other embodiments of the disclosure, an electronic device includes a substrate, a first metal pattern, and a second metal pattern. The first metal pattern is disposed on the substrate and has a first skin depth. The second metal pattern is disposed on the first metal pattern and has a second skin depth. The second metal pattern includes a first contact portion and a second contact portion in contact with the first metal pattern. In a cross-sectional view, at least one of a width of the first contact portion in a first direction and a width of the second contact portion in a first direction is greater than or equal to a greater one of the first skin depth and the second skin depth.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAIL DESCRIPTION OF THE EMBODIMENTS

Figure 1A:
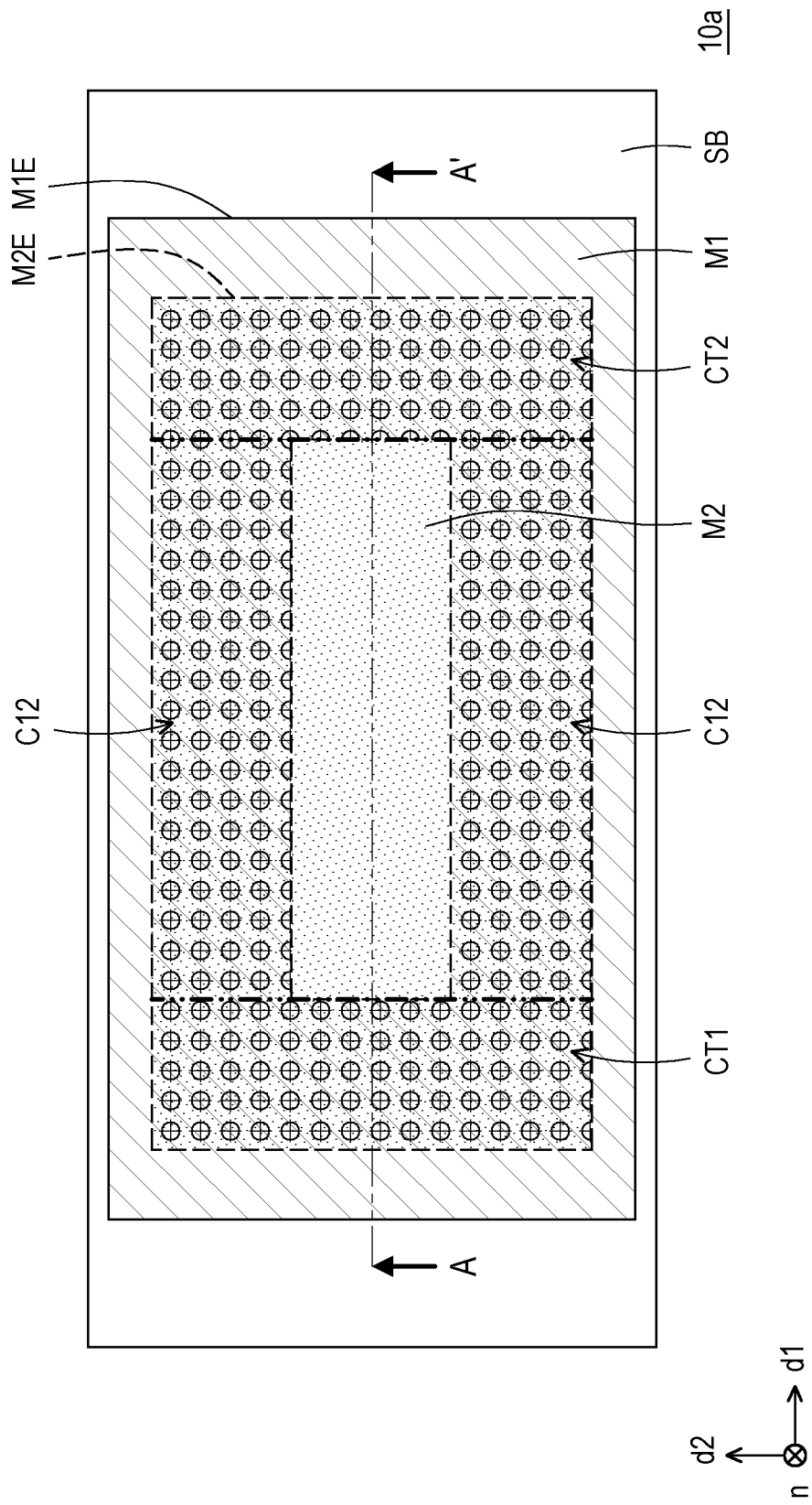
FIG. 1A is a schematic partial top view of an electronic device according to a first embodiment of the disclosure.

The disclosure may be understood with reference to the following detailed description together with the drawings. Note that for ease of understanding and simplicity of drawings, the drawings of the disclosure show part of an electronic device, and certain elements in the drawings may not be drawn to scale. In addition, the number and size of each element shown in the drawings only serve for exemplifying instead of limiting the scope of the disclosure.

Throughout the description of the disclosure and the appended claims, certain terms are used to refer to specific elements. Those skilled in the art should understand that electronic device manufacturers may refer to the same elements by different names. It is not intended herein to distinguish between elements that have the same function but different names. In the following description and claims, the terms "comprise" and "include" are open-ended terms, and should thus be interpreted to mean "comprise but not limited to . . . ". Therefore, the use of the terms "comprise", "include", and/or "have" in the description of the drawings specifies the presence of corresponding features, regions, steps, operations, and/or members, but does not exclude the presence of one or more corresponding features, regions, steps, operations, and/or members.

The directional terms mentioned herein, like "above", "below", "front", "back', "left", "right", and the like, refer only to the directions in the accompanying drawings. Therefore, the directional terms are used for describing instead of limiting the disclosure. The drawings show general characteristics of methods, structures and/or materials used in specific embodiments.

However, the drawings should not be construed as defining or limiting the scope or properties encompassed by these embodiments. For example, the relative size, thickness, and position of each film layer, region, or structure may be reduced or enlarged for clarity.

When a corresponding member (an element or film layer) is referred to as being "on another member", the member may be directly on the another member, or other members may be present in between. On the other and, when a member is referred to as being "directly on another member", no other members are present in between. In addition, when a member is referred to as being "on another member", these two members have a relationship of being above and below in the top view direction, depending on the orientation of the device, and the member may be above or below the another member.

The term "about", "equal", "identical" or "same", "substantially", or "essentially" is generally interpreted as being within a range of 20% of a given value, or interpreted as being in a range of 10%, 5%, 3%, 2%, 1%, or 0.5% of a given value.

In the description and claims, the use of an ordinal number such as "first", "second", and so on to modify an element does not by itself connote or represent any preceding ordinal number of the element(s); any priority, precedence, or order of one element over another; or the order in which a manufacturing method is performed, but only to clearly distinguish an element having a certain name from another element having the same name. The same terms may be not used in the claims as used in the description, and accordingly a first member in the description may be a second member in the claims.

It should be noted that technical features in different embodiments described below can be replaced, recombined, or mixed with one another to constitute another embodiment without departing from the spirit of the disclosure. The features in various embodiments can be arbitrarily mixed and combined for use without departing from or conflicting with the spirit of the disclosure.

Electrical connection or coupling described in the disclosure may refer to "direct connection" or "indirect connection". In the case of direct connection, end points of elements on two circuits are directly connected or interconnected by a conductor wire segment. In the case of indirect connection, present between end points of elements on two circuits is a switch, a diode, a capacitor, an inductor, other suitable elements, or a combination of the above elements, but not limited thereto.

In the disclosure, a thickness, a length, and a width may be measured using an optical microscope, and the thickness may be measured from a cross-sectional image shown in an electron microscope, but not limited thereto. In addition, certain errors may exist between any two values or directions for comparison. If a first value is equal to a second value, the equivalence implies that there may be an error of about 10% between the first value and the second value. If a first direction is perpendicular to a second direction, the angle between the first direction and the second direction may be between 80 degrees and 100 degrees. If a first direction is parallel to a second direction, the angle between the first direction and the second direction may be between 0 degree and 10 degrees.

An electronic component may have a multi-layer circuit structure according to embodiments of the disclosure. The electronic component of the disclosure is applicable to an electronic device including antenna (e.g., liquid crystal antenna), display, light emitting, sensing, touch, tiled, other suitable functions, or a combination of the above functions, but not limited thereto. The electronic device may include a bendable or flexible electronic device, but not limited thereto. The display device may include, for example but not limited to, liquid crystals, light-emitting diodes, quantum dots (QD), fluorescence, phosphor, other suitable materials, or a combination of the above materials. The light-emitting diode may include, for example but not limited to, an organic light-emitting diode (OLED), a micro LED, a mini LED, or a quantum dot light-emitting diode (QLED or QDLED). The electronic component may include a transistor, a circuit board, a chip, a die, an integrated circuit (IC), or a combination of the above components or other suitable electronic component, but not limited thereto.

Reference will now be made in detail to the exemplary embodiments of the disclosure, examples of which are described in the accompanying drawings. Wherever possible, the same reference numerals are used in the drawings and the detailed description to refer to the same or similar parts.

Figure 1B:
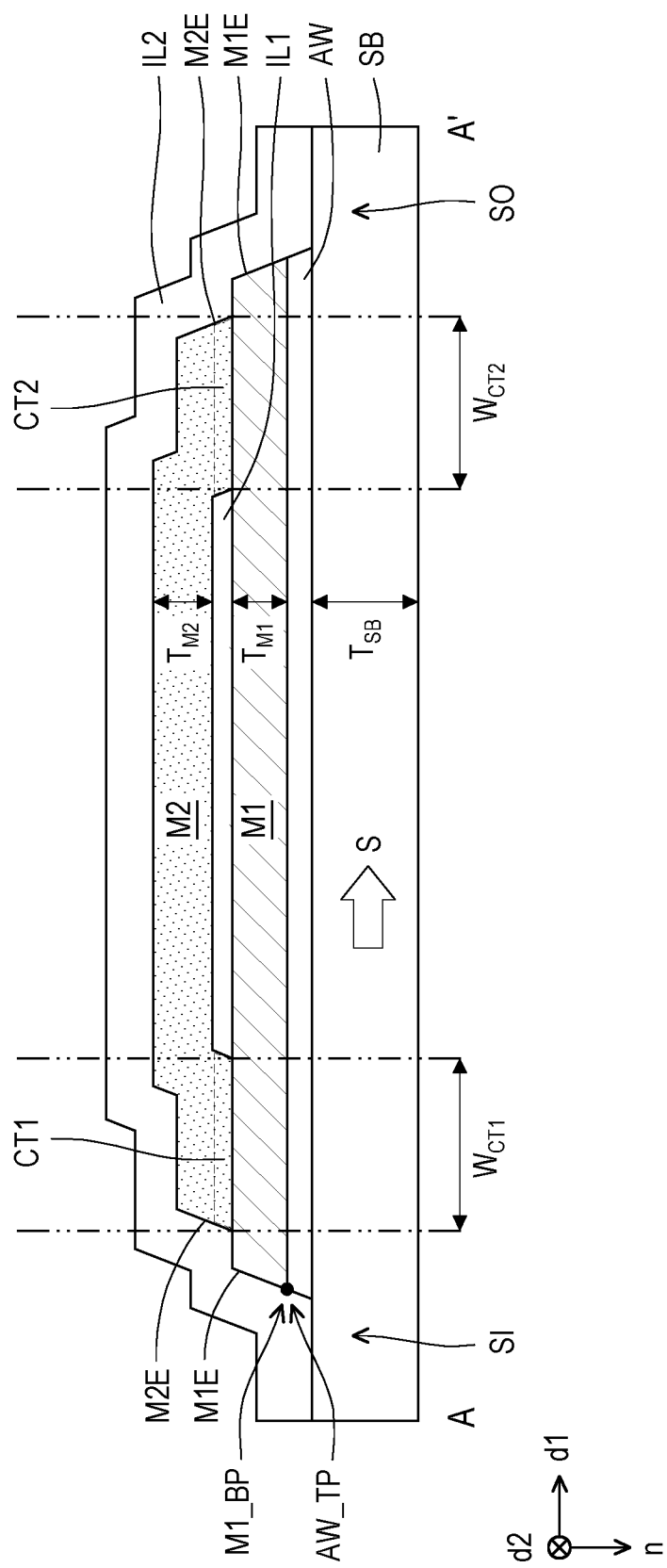
FIG. 1B is a schematic cross-sectional view taken according to section line A-A' of FIG. 1A.

FIG. 1A is a schematic partial top view of an electronic device according to a first embodiment of the disclosure, and FIG. 1B is a schematic cross-sectional view taken according to section line A-A' of FIG. 1A.

With reference to FIG. 1A and FIG. 1B together, an electronic device 10a (FIG. 1A) of this embodiment includes a substrate SB, a metal pattern M1, an insulating pattern IL1 (FIG. 1B), and a metal pattern M2. In this embodiment, the electronic device 10a (FIG. 1A) is an antenna device, but the disclosure is not limited thereto.

For example, as shown in FIG. 1B, the substrate SB may serve as a transmission path of a signal S. For example, the substrate SB may be provided with a signal source (not shown) at one side thereof, and the signal source may be configured to provide radio waves, microwaves, or other electromagnetic waves with different wavelength ranges. In this embodiment as shown in FIG. 1B, the signal S provided by the signal source (not shown) may be transmitted from a signal input terminal SI of the substrate SB to a signal output terminal SO of the substrate SB along a first direction d1, but the disclosure is not limited thereto. For example, the material of the substrate SB may be glass, plastic, or a combination thereof which reduces the loss of the signal S during transmission therein. In this embodiment, the material of the substrate SB is glass, but the disclosure is not limited thereto. In some embodiments as shown in FIG. 1B, in a cross-sectional view, a thickness $T_{SB}$ of the substrate SB may be less than 1 mm ($T_{SB}$<1 mm), for example. The thickness of the substrate SB meeting this range can also reduce the loss of the signal S during transmission therein. For example, the cross-sectional view mentioned here may be taken according to a section cut along section line A-A' is seen, namely a direction of viewing from a second direction d2. For example, the cross-sectional mentioned later may also be regarded as the direction viewed from the second direction d2, but the disclosure is not limited thereto. In other embodiments, the cross-sectional view may be the direction of viewing from the first direction d1. In some embodiments, the first direction d1 may be orthogonal to the second direction d2, but the disclosure is not limited thereto.

The metal pattern M1 is disposed on the substrate SB, for example. For example, the material of the metal pattern M1 may include copper, aluminum, or other suitable metals, but the disclosure is not limited thereto. In some embodiments, the metal pattern M1 may serve to reduce penetration of the signal S into the substrate SB. To be specific, the metal pattern M1 may serve as a wall of the transmission path of the signal S, for example. When the signal S travels to the metal pattern M1 in the substrate SB, the metal pattern M1 may reflect the signal S back to the substrate SB, for example, to continue transmitting the signal S in the substrate SB. In this embodiment, the metal pattern M1 has a skin depth, and a thickness $T_{M1}$ (FIG. 1B) of the metal pattern M1 in the cross-sectional view is greater than or equal to the skin depth of the metal pattern M1. In a mathematical sense, for example, the skin depth of the metal pattern M1 is a depth at which the current density in the metal pattern M1 is reduced to 1/e (e=2.71828183) of the current density at the surface of the metal pattern M1. In a physical sense, the current in the metal pattern M1 is substantially concentrated in this region from the surface of the metal pattern M1 to the skin depth of the metal pattern M1. Such uneven current distribution is referred to as the skin effect. According to the skin effect, the strength of the alternating electromagnetic field (e.g., generated by the signal S) in the metal pattern M1 decreases exponentially along with the depth into the metal pattern M1. Based on this, when the thickness $T_{M1}$ of the metal pattern M1 in the cross-sectional view is greater than or equal to the skin depth, it is possible to reduce penetration of the signal S into the substrate SB and reduce the loss of the signal S during transmission in the substrate SB. For example, the skin depth may be derived by the following equation:

$D_M = (\rho/\pi f\mu)^{1/2}$, where $D_M$ is the skin depth of the metal pattern, $\rho$ is the resistivity of the metal pattern, $\pi$ is the ratio of a circle's circumference to its diameter, f is the frequency of the signal S, and $\mu$ is the absolute permeability of the metal pattern.

In some embodiments, in the cross-sectional view, the thickness $T_{M1}$ of the metal pattern M1 may be 0.1 μm to 1 μm (0.1 μm<$T_{M1}$<1 μm). For example, the thickness $T_{M1}$ of the metal pattern M1 is measured from the normal direction n of the substrate SB and the normal direction n of the substrate SB is orthogonal to the first direction d1 and the second direction d2. Since the thermal expansion coefficient of the metal pattern M1 is greater than the thermal expansion coefficient of the substrate SB, when the metal pattern M1 and the substrate SB is subjected to a high temperature process, for example, the substrate SB tends to warp in a direction facing the metal pattern M1. When the thickness of the metal pattern M1 meets the range above, warpage generated in the substrate SB can be reduced.

For example, the insulating pattern IL1 is disposed on the metal pattern M1. In some embodiments, the insulating pattern IL1 exposes part of the metal pattern M1 in the normal direction n of the substrate SB. For example, in this embodiment, the insulating pattern IL1 is disposed on the central region of the metal pattern M1 but not disposed on the edge region of the metal pattern M1, thus exposing the edge region of the metal pattern M1, but the disclosure is not limited thereto. For example, the material of the insulating pattern IL1 may include an inorganic material (e.g., silicon oxide, silicon nitride, silicon oxynitride, or a stack layer of at least two of the above materials), an organic material (e.g., polyimide-based resin, epoxy-based resin, or acrylic-based resin), or a combination thereof, but the disclosure is not limited thereto.

For example, the metal pattern M2 is disposed on the metal pattern M1 and/or the insulating pattern IL1. The material of the metal pattern M2 may be the same as or different from the material of the metal pattern M1, and the disclosure is not limited thereto. In some embodiments, in the cross-sectional view, a thickness $T_{M2}$ (FIG. 1B) of the metal pattern M2 may be 0.1 μm to 1 μm (0.1 μm<$T_{M2}$<1 μm). For example, the thickness $T_{M2}$ of the metal pattern M2 is measured from the normal direction n of the substrate SB. For example, the thickness $T_{M2}$ may be the thickness of the metal pattern M2 above the insulating layer IL1 in the normal direction n, for example but not limited thereto. In some embodiments, the metal pattern M2 together with the metal pattern M1 may serve to reduce penetration of the signal S into the substrate SB. The principle is as described above and will not be repeatedly described here. In other words, the metal pattern M2 has a skin depth, and the thickness $T_{M2}$ of the metal pattern M2 in the cross-sectional view is greater than or equal to the skin depth of the metal pattern M2.

In this embodiment, the metal pattern M2 includes a contact portion CT1 and a contact portion CT2. The contact portion CT1 and the contact portion CT2 are in contact with the metal pattern M1. The insulating pattern IL1 is in contact with the metal pattern M1 and the metal pattern M2 between the contact portion CT1 and the contact portion CT2. To be specific, for example, the metal pattern M2 covers the insulating pattern IL1 in the normal direction n of the substrate SB, and the part of the metal pattern M2 exceeding the insulating pattern IL1 is in contact with the metal pattern M1 exposed by the insulating pattern IL1 to electrically connect the metal pattern M2 and the metal pattern M1. The metal pattern M2 may further include a contact portion C12 (FIG. 1A) in contact with the metal pattern M1. The insulating pattern IL1 is located between the contact portion CT1 and the contact portion CT2 in the first direction d1. For example, the contact portion CT1 and the contact portion CT2 are respectively adjacent to terminals for transmission of the signal S in the substrate SB. For example, the contact portion C12 is located between the contact portion CT1 and the contact portion CT2, and both ends of the contact portion C12 are respectively connected to the contact portion CT1 and the contact portion CT2 in the first direction d1. In this embodiment, the contact portion CT1 is adjacent to the signal input terminal SI of the signal S in the substrate SB, and the contact portion CT2 is adjacent to the signal output terminal SO of the signal S in the substrate SB.

In addition, in this embodiment, in the cross-sectional view, an edge M2E of the second metal pattern M2 is recessed from an edge M1E of the first metal pattern M1, but the disclosure is not limited thereto. Here, the edge M2E of the metal pattern M2 being recessed from the edge M1E of the metal pattern M1 refers to that, in the cross-sectional view, the edge M2E of the metal pattern M2 does not exceed at least the edge M1E of the metal pattern M1. In addition, in some embodiments, the insulating pattern IL1 may have a relatively thin thickness, for example, from 5 μm to 100 μm (i.e., 5 μm<thickness of insulating pattern IL1<100 μm), but not limited thereto. By the insulating pattern IL1 having a relatively thin thickness, the part of the metal pattern M2 separated by the insulating pattern IL1 may be coupled to the metal pattern M1, further reducing the loss of the signal S during transmission, but the disclosure is not limited thereto.

For example, the thickness of the insulating pattern IL1 is measured from the normal direction n of the substrate SB.

In some embodiments, a width $W_{CT1}$ (FIG. 1B) of the contact portion CT1 in the first direction d1 (the direction in which the signal S is transmitted) and a width $W_{CT2}$ (FIG. 1B) of the contact portion CT2 in the first direction d1 are greater than or equal to a greater one of the skin depth of the metal pattern M1 and the skin depth of the metal pattern M2. Alternatively, in other embodiments, the width of at least one of the contact portion CT1 and the contact portion CT2 in the first direction d1 is greater than or equal to the greater one of the skin depth of the metal pattern M1 and the skin depth of the metal pattern M2. According to the skin effect, the strength of the alternating electromagnetic field (e.g., generated by the signal S) in the contact portion CT1 and/or the contact portion CT2 decreases exponentially along with not only the depth but also the width into the contact portion CT1 and/or the contact portion CT2. Based on the skin effect, when the width $W_{CT1}$ of the contact portion CT1 in the first direction d1 and the width $W_{CT2}$ of the contact portion CT2 in the first direction d1 are greater than or equal to the greater one of the skin depth of the metal pattern M1 and the skin depth of the metal pattern M2, it is also possible to reduce penetration of the signal S into the substrate SB and reduce the loss of the signal S during transmission in the substrate SB.

Based on the technical contents recited above, in the electronic device 10a of this embodiment, the metal layer is divided into the metal pattern M1 and the metal pattern M2, and the insulating pattern IL1 in contact with the metal pattern M1 and the metal pattern M2 is disposed between the metal pattern M1 and the metal pattern M2. Through the above design, warpage generated in the substrate SB may be reduced without increasing the thickness of the substrate SB. Furthermore, in the electronic device 10a of this embodiment, by the thickness $T_{M1}$ of the metal pattern M1 and the thickness $T_{M2}$ of the metal pattern M2 being greater than or equal to the skin depth of the metal pattern M1 and the skin depth of the metal pattern M2, it is possible to reduce penetration of the signal S into the substrate SB and reduce the loss of the signal S during transmission in the substrate SB. In addition, in the electronic device 10a of this embodiment, by the width $W_{CT1}$ of the contact portion CT1 and the width $W_{CT2}$ of the contact portion CT2 being greater than or equal to the greater one of the skin depth of the metal pattern M1 and the skin depth of the metal pattern M2, it is also possible to reduce penetration of the signal S into the substrate SB and reduce the loss of the signal S during transmission in the substrate SB.

In addition, the electronic device 10a of this embodiment may further include an anti-warping layer AW and an insulating pattern IL2.

For example, the anti-warping layer AW (FIG. 1B) is disposed between the metal pattern M1 and the substrate SB. For example, the anti-warping layer AW may include an inorganic material (e.g., silicon oxide, silicon nitride, silicon oxynitride, or a stack layer of at least two of the above materials), an organic material (e.g., polyimide-based resin, epoxy-based resin, or acrylic-based resin), or a combination thereof, but the disclosure is not limited thereto. For example, the anti-warping layer AW may be a single-layer or multi-layer structure, but the disclosure is not limited thereto. For example, a material may be selected for the anti-warping layer AW including an appropriate thermal expansion coefficient or a material with a stress opposite to that of the metal pattern when subjected to a high temperature process to reduce warpage generated in the substrate SB. In this embodiment, an edge of the anti-warping layer AW is aligned with the edge MIE of the metal pattern M1 (i.e., a bottom point M1_BP (FIG. 1B) of the metal pattern M1 is in contact with a top point AW_TP (FIG. 1B) of the anti-warping layer AW, for example), so that the length of the anti-warping layer AW in the first direction d1 is substantially equal to the length of the metal pattern M1 in the first direction d1, but the disclosure is not limited thereto. In some embodiments, the length of the anti-warping layer AW in the first direction d1 is greater than the length of the metal pattern M1 in the first direction, or is further substantially the same as the length of the substrate SB in the first direction, thus more effectively reducing warpage of the substrate SB. In other embodiments, it is possible that the anti-warping layer AW is not disposed between the metal pattern M1 and the substrate SB.

For example, the insulating pattern IL2 is disposed on the metal pattern M2. In some embodiments, the insulating pattern IL2 covers the metal pattern M2 and the metal pattern M1 in the normal direction n of the substrate SB to serve to protect the metal pattern M2 and the metal pattern M1, but the disclosure is not limited thereto. For example, the material of the insulating pattern IL2 may include an inorganic material (e.g., silicon oxide, silicon nitride, silicon oxynitride, or a stack layer of at least two of the above materials), an organic material (e.g., polyimide-based resin, epoxy-based resin, or acrylic-based resin), or a combination thereof, but the disclosure is not limited thereto.

Figure 2A:
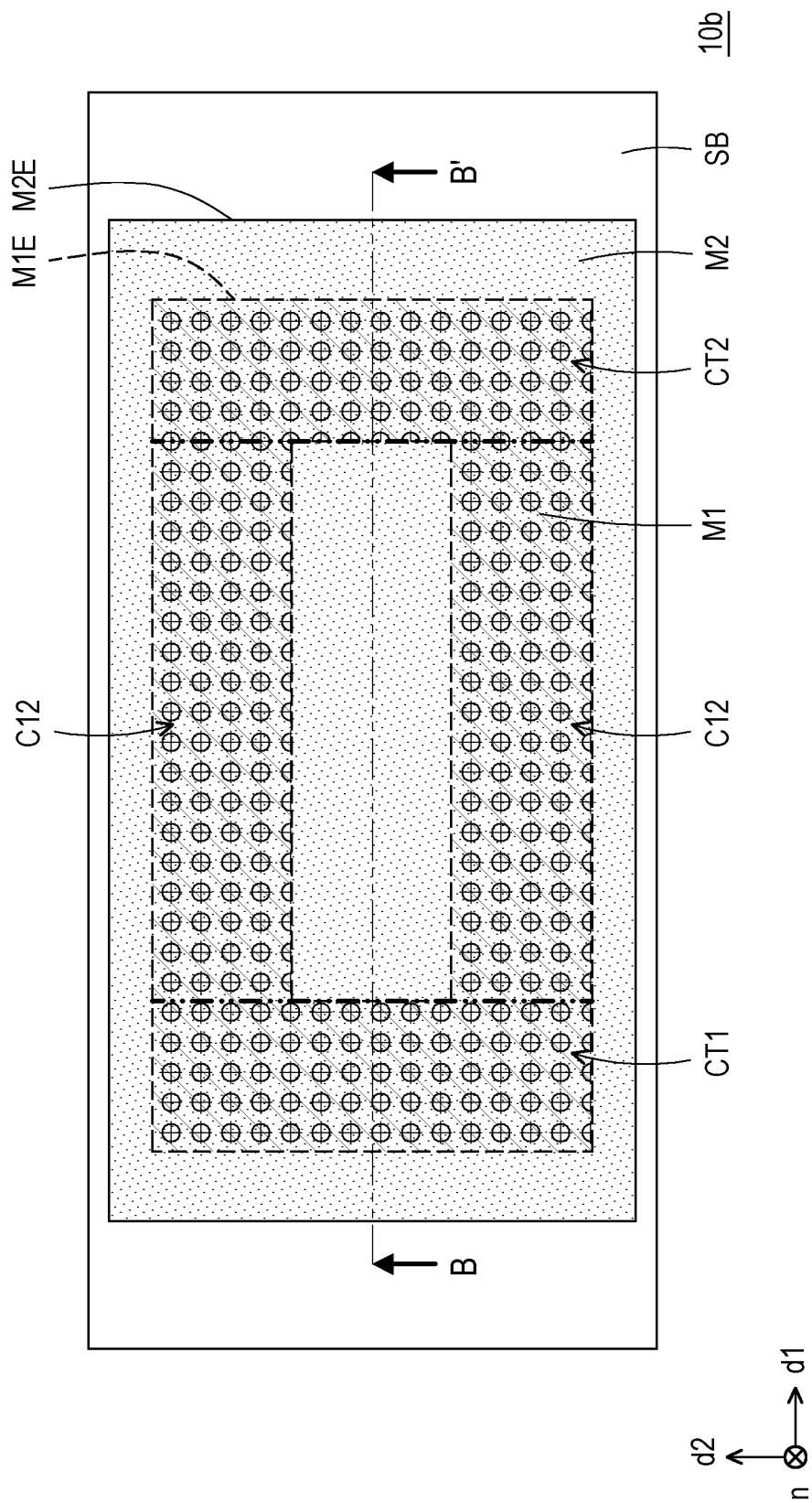
FIG. 2A is a schematic partial top view of an electronic device according to a second embodiment of the disclosure.
Figure 2B:
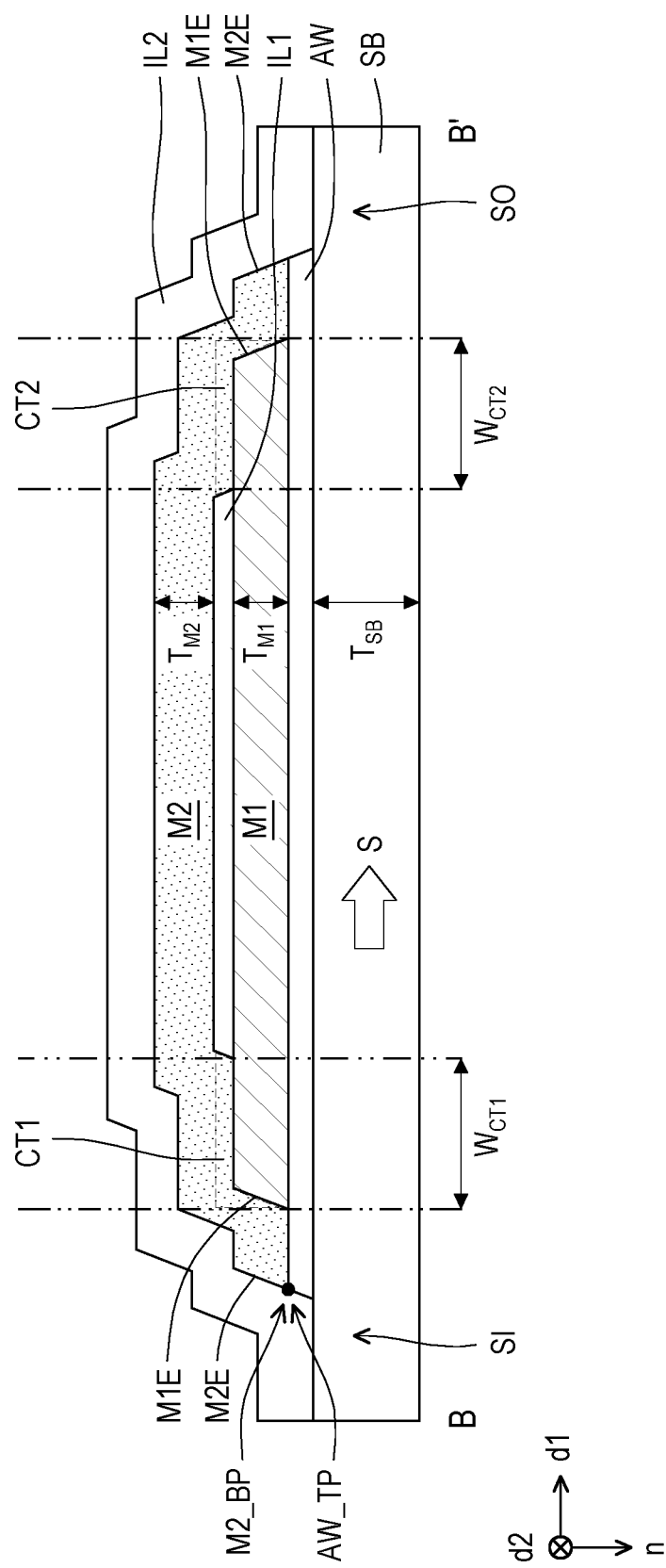
FIG. 2B is a schematic cross-sectional view taken according to section line B-B' of FIG. 2A.

FIG. 2A is a schematic partial top view of an electronic device according to a second embodiment of the disclosure, and FIG. 2B is a schematic cross-sectional view taken according to section line B-B' of FIG. 2A. It should be noted that the reference numerals and part of the contents of the embodiment of FIG. 1A and FIG. 1B may remain to be used in the embodiment of FIG. 2A and FIG. 2B, where the same or similar reference numerals are used to refer to the same or similar elements, and the description of the same technical content is omitted.

With reference to FIG. 2A and FIG. 2B together, an electronic device 10b of FIG. 2A of this embodiment is mainly different from the electronic device 10a of FIG. 1A in that the edge M2E of the metal pattern M2 exceeds the edge MIE of the metal pattern M1 in the cross-sectional view. To be specific, the metal pattern M2 covers the metal pattern M1 in the normal direction n of the substrate SB, so that the edge M2E of the metal pattern M2 exceeds the edge MIE of the metal pattern M1 in the normal direction n of the substrate SB. In this embodiment, for example, the anti-warping layer AW of FIG. 2B is disposed between the metal pattern M1 and the substrate SB. The edge of the anti-warping layer AW is aligned with the edge M2E of the metal pattern M2 (i.e., a bottom point M2_BP of FIG. 2B of the metal pattern M2 is in contact with the top point AW_TP of FIG. 2B of the anti-warping layer AW, for example), so that the length of the anti-warping layer AW in the first direction d1 is substantially equal to the length of the metal pattern M2 in the first direction d1, but the disclosure is not limited thereto. In some embodiments, the length of the anti-warping layer AW in the first direction d1 is greater than the length of the metal pattern M2 in the first direction, or is further substantially the same as the length of the substrate SB in the first direction, thus more effectively reducing warpage of the substrate SB. In other embodiments, it is possible that the anti-warping layer AW is not disposed.

Figure 3A:
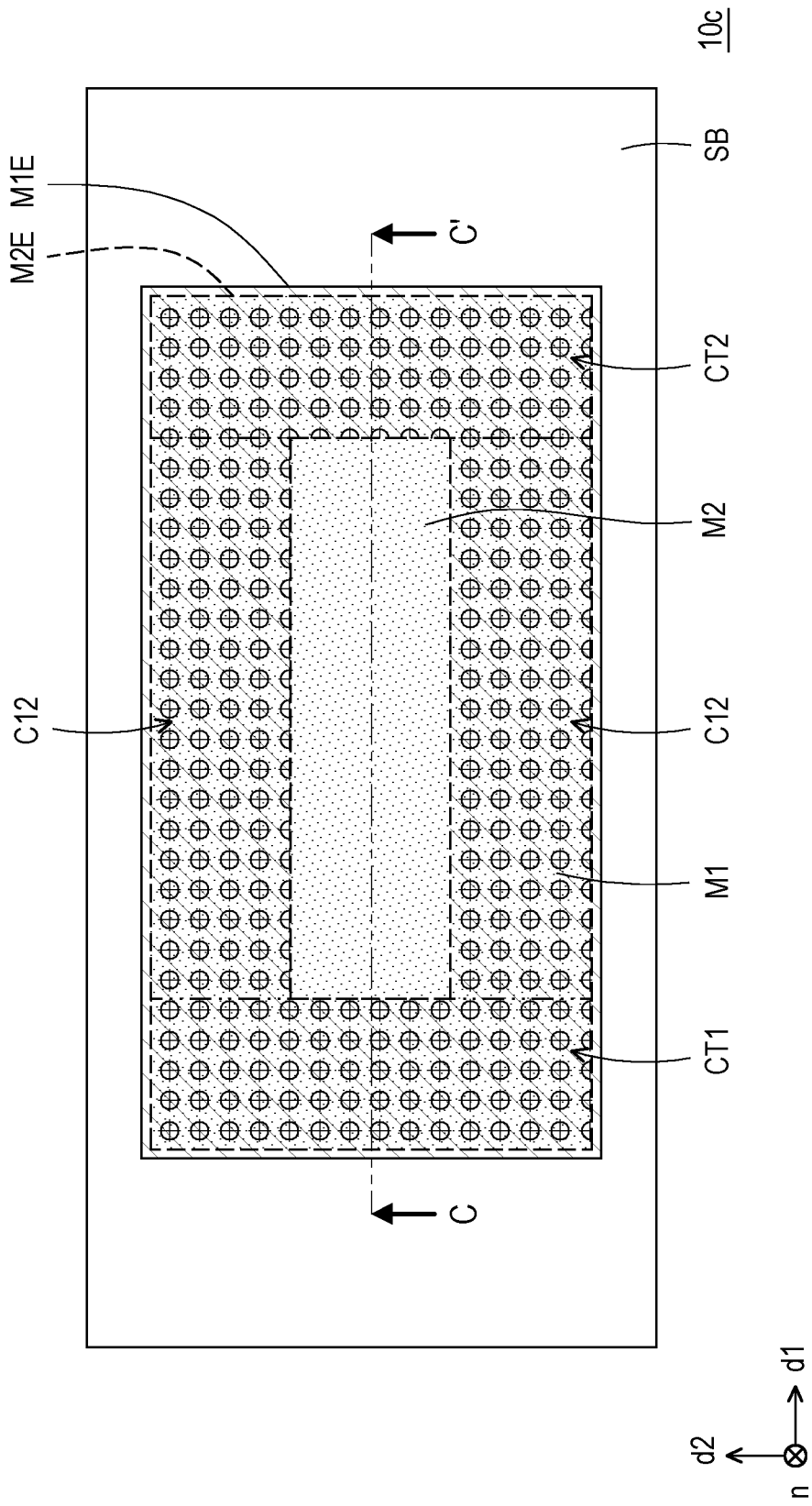
FIG. 3A is a schematic partial top view of an electronic device according to a third embodiment of the disclosure.
Figure 3B:
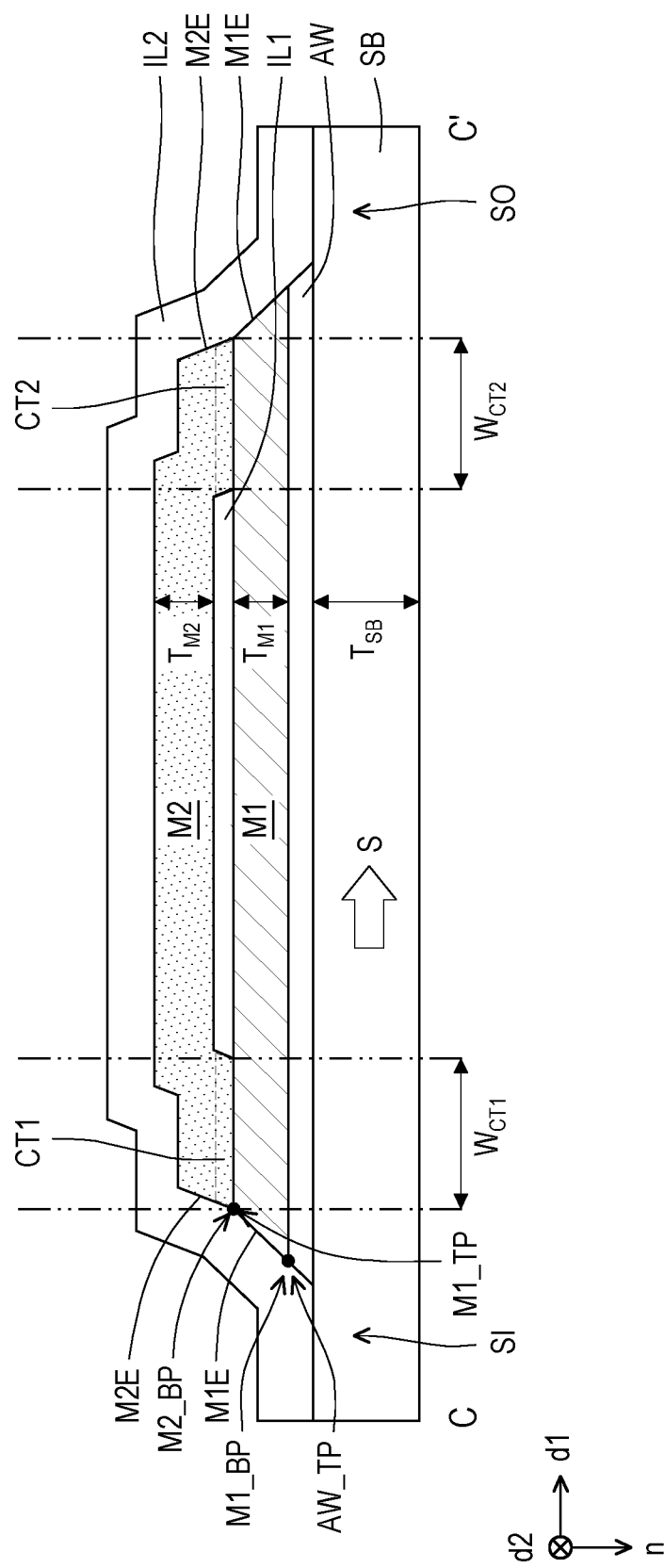
FIG. 3B is a schematic cross-sectional view taken according to section line C-C' of FIG. 3A.

FIG. 3A is a schematic partial top view of an electronic device according to a third embodiment of the disclosure, and FIG. 3B is a schematic cross-sectional view taken according to section line C-C' of FIG. 3A. It should be noted that the reference numerals and part of the contents of the embodiment of FIG. 1A and FIG. 1B may remain to be used in the embodiment of FIG. 3A and FIG. 3B, where the same or similar reference numerals are used to refer to the same or similar elements, and the description of the same technical content is omitted.

With reference to FIG. 3A and FIG. 3B together, an electronic device 10c of FIG. 3A of this embodiment is mainly different from the electronic device 10a of FIG. 1A in that the edge M2E of the metal pattern M2 is aligned with the edge M1E of the metal pattern M1 in the cross-sectional view. To be specific, the edge M2E of the metal pattern M2 is aligned with the edge M1E of the metal pattern M1 in the normal direction n of the substrate SB, and the bottom point M2_BP of FIG. 3B of the metal pattern M2 is in contact with a top point M1_TP of FIG. 3B of the metal pattern M1, for example, as shown in FIG. 3B, but the disclosure is not limited to such a definition. In this embodiment, for example, the anti-warping layer AW of FIG. 3B is disposed between the metal pattern M1 and the substrate SB. The edge of the anti-warping layer AW is aligned with the edge M1E of the metal pattern M1 (i.e., the bottom point M1_BP of the metal pattern M1 is in contact with the top point AW_TP of FIG. 3B of the anti-warping layer AW, for example), so that the length of the anti-warping layer AW in the first direction d1 is substantially equal to the length of the metal pattern M1 in the first direction d1, but the disclosure is not limited thereto. In some embodiments, the length of the anti-warping layer AW in the first direction d1 is greater than the length of the metal pattern M1 in the first direction, or is further substantially the same as the length of the substrate SB in the first direction, thus more effectively reducing warpage of the substrate SB. In other embodiments, it is possible that the anti-warping layer AW is not disposed between the metal pattern M1 and the substrate SB.

The embodiments of the electronic device 10a of FIG. 1A, the electronic device 10b of FIG. 2A, and the electronic device 10c of FIG. 3A respectively show the following cases: (1) the edge M2E of the metal pattern M2 is recessed from the edge M1E of the metal pattern M1; (2) the edge M2E of the metal pattern M2 exceeds the edge M1E of the metal pattern M1; and (3) the edge M2E of the metal pattern M2 is aligned with the edge M1E of the metal pattern M1. However, the disclosure is not limited to these embodiments. For example, in other embodiments, the edge M2E at one side of the metal pattern M2 may be recessed from the edge M1E of the metal pattern M1 and the edge M2E at the other side of the metal pattern M2 may exceed the edge M1E of the metal pattern M1 in the first direction d1. Alternatively, the edge M2E at one side of the metal pattern M2 may be aligned with the edge M1E of the metal pattern M1 and the edge M2E at the other side of the metal pattern M2 may exceed the edge M1E of the metal pattern M1 in the first direction d1. In other words, the disclosure does not limit the edges of the metal pattern M2 and the edges of the metal pattern M1 to a relationship of being both recessed, exceeded, or aligned.

Figure 4A:
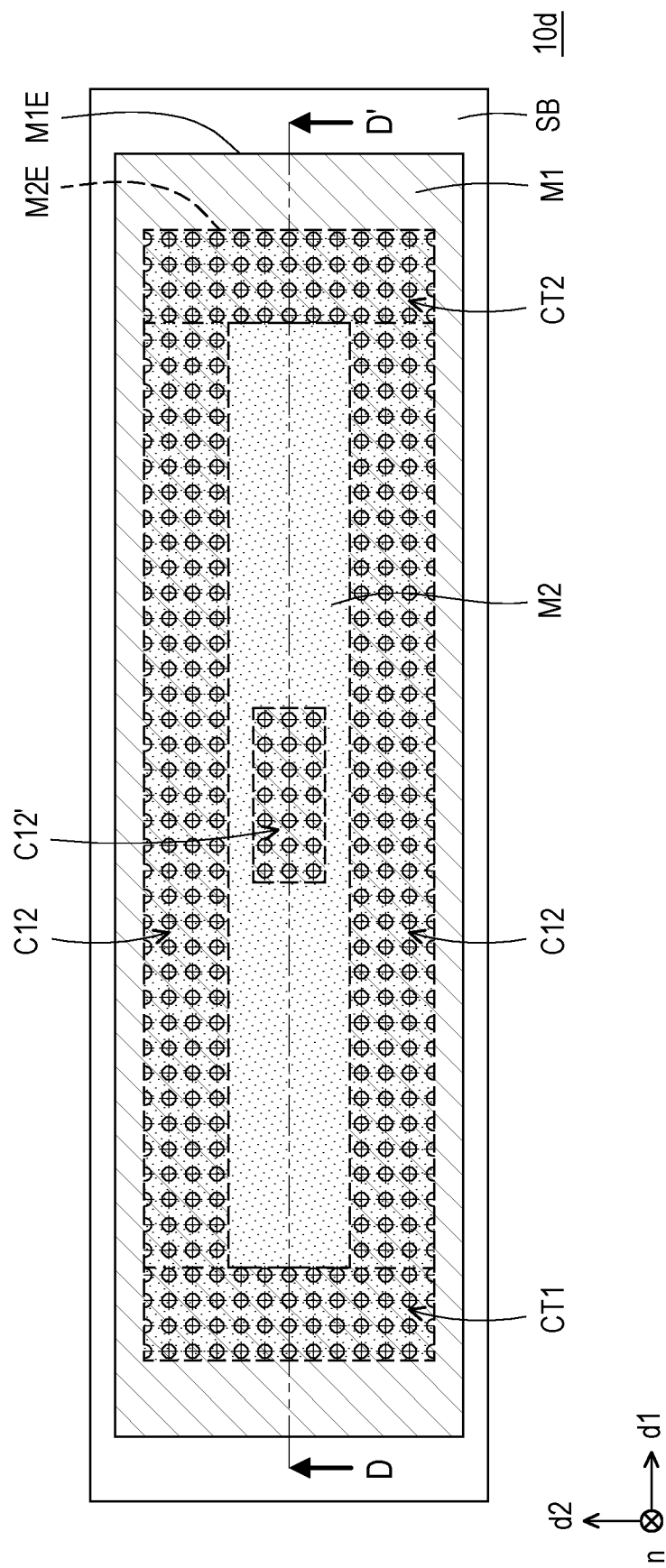
FIG. 4A is a schematic partial top view of an electronic device according to a fourth embodiment of the disclosure.
Figure 4B:
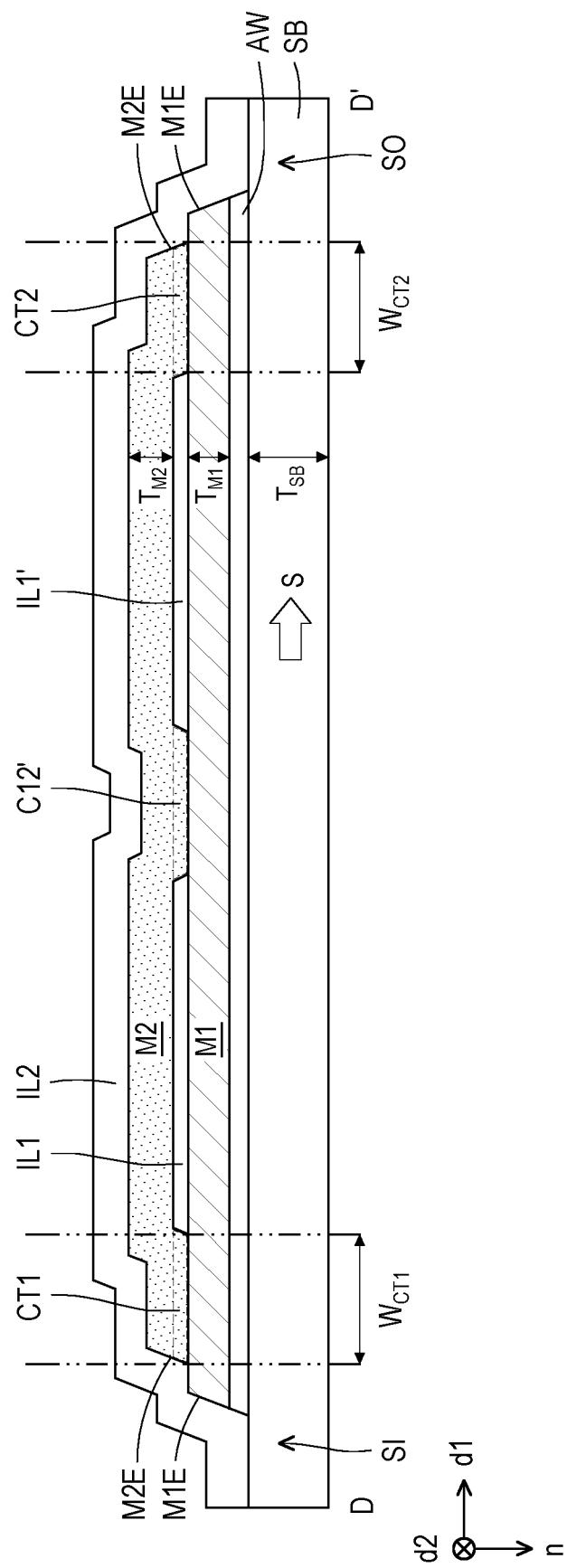
FIG. 4B is a schematic cross-sectional view taken according to section line D-D' of FIG. 4A.

FIG. 4A is a schematic partial top view of an electronic device according to a fourth embodiment of the disclosure, and FIG. 4B is a schematic cross-sectional view taken according to section line D-D' of FIG. 4A. It should be noted that the reference numerals and part of the contents of the embodiment of FIG. 1A and FIG. 1B may remain to be used in the embodiment of FIG. 4A and FIG. 4B, where the same or similar reference numerals are used to refer to the same or similar elements, and the description of the same technical content is omitted.

With reference to FIG. 4A and FIG. 4B together, an electronic device 10d of FIG. 4A of this embodiment is mainly different from the electronic device 10a of FIG. 1A in that the electronic device 10d further includes an insulating pattern IL1' as shown in FIG. 4B in the cross-sectional view, the insulating pattern IL1' is disposed on the metal pattern M1 and is adjacent to the insulating pattern IL1, and the metal pattern M2 is further disposed on the insulating pattern IL1'.

To be specific, for example, the insulating pattern IL1' may be formed together with the insulating pattern IL1 on the metal pattern M1 through the same process. In the cross-sectional view, for example, the insulating pattern IL1' is adjacent to the insulating pattern IL1 in the first direction d1, but the disclosure is not limited thereto. In this embodiment, for example, the insulating pattern IL1' and the insulating pattern IL1 formed on the metal pattern M1 through the same process may form a rectangular shape in a top view direction (i.e., viewed from the normal direction n) of the substrate SB, but the disclosure is not limited thereto. Therefore, the insulating pattern IL1' is also in contact with the metal pattern M1 and the metal pattern M2 between the contact portion CT1 and the contact portion CT2, for example. In addition, in this embodiment, the metal pattern M2 covers the insulating pattern IL1' in the normal direction n of the substrate SB, so the metal pattern M2 also exceeds the insulating pattern IL1'.

In this embodiment, the metal pattern M2 further includes a contact portion C12' (FIG. 4A), and the contact portion C12' is in contact with the metal pattern M1. To be specific, since the insulating pattern IL1' and the insulating pattern IL1 may form a rectangular shape when viewed from the normal direction n of the substrate SB, for example, the contact portion C12' of the metal pattern M2 may be in contact with the exposed metal pattern M1 within the rectangular shape formed by the insulating pattern IL1' and the insulating pattern IL1, for example. In other words, the contact portion C12' is located between the insulating pattern IL1 and the insulating pattern IL1' in the first direction d1. In addition, the contact portion C12' is also located between the contact portion CT1 and the contact portion CT2 in the first direction d1, for example.

The embodiment of the electronic device 10d shows that the edge M2E of the metal pattern M2 is recessed from the edge M1E of the metal pattern M1. However, the disclosure is not limited to this embodiment. For example, in other embodiments, the edge M2E of the metal pattern M2 may exceed the edge M1E of the metal pattern M1 in the first direction d1. Alternatively, the edge M2E of the metal pattern M2 may be aligned with the edge M1E of the metal pattern M1 in the first direction d1. In addition, as described in the embodiments above, the disclosure does not limit the edges of the metal pattern M2 and the edges of the metal pattern M1 to a relationship of being both recessed, exceeded, or aligned.

Figure 5A:
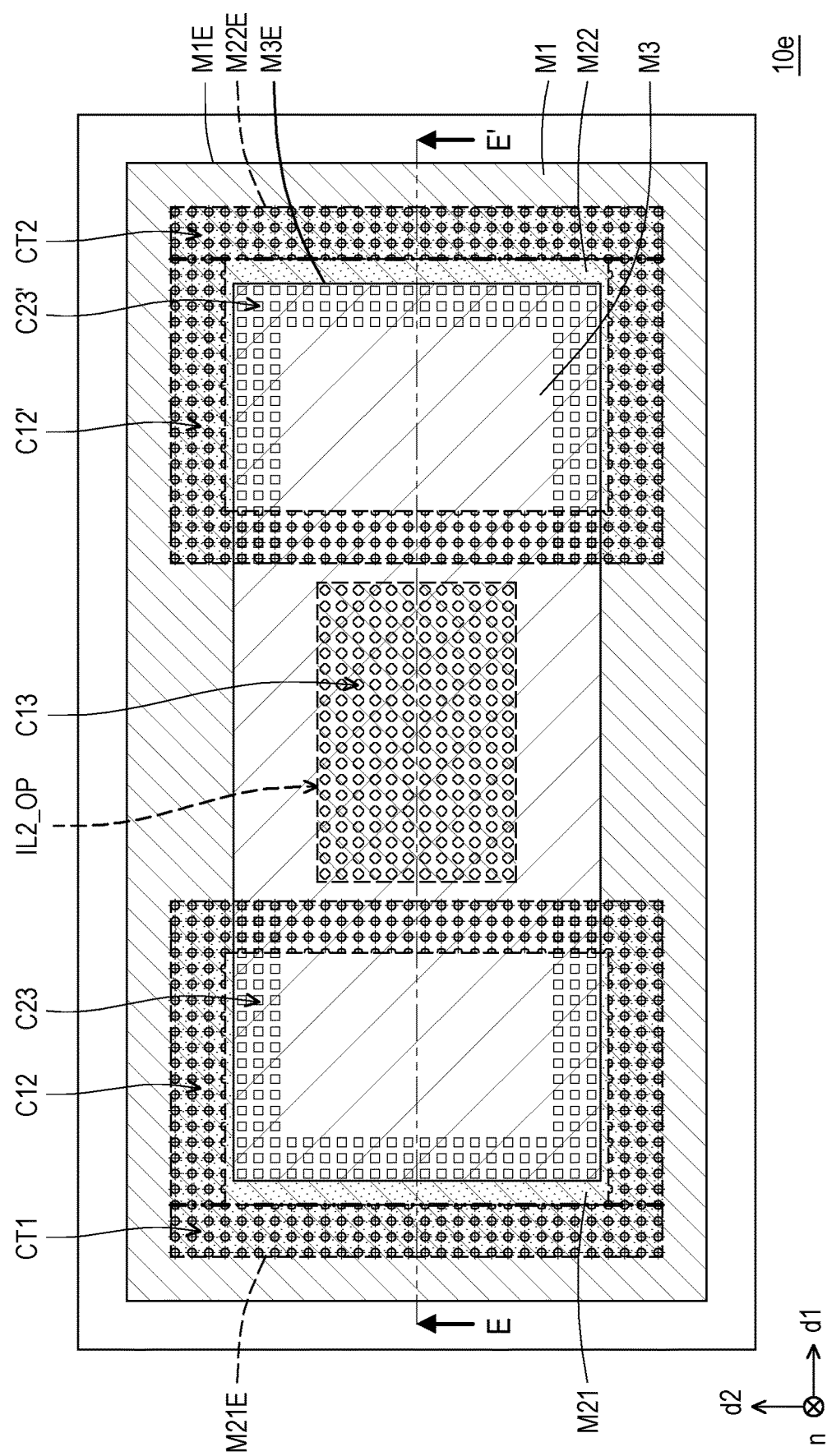
FIG. 5A is a schematic partial top view of an electronic device according to a fifth embodiment of the disclosure.
Figure 5B:
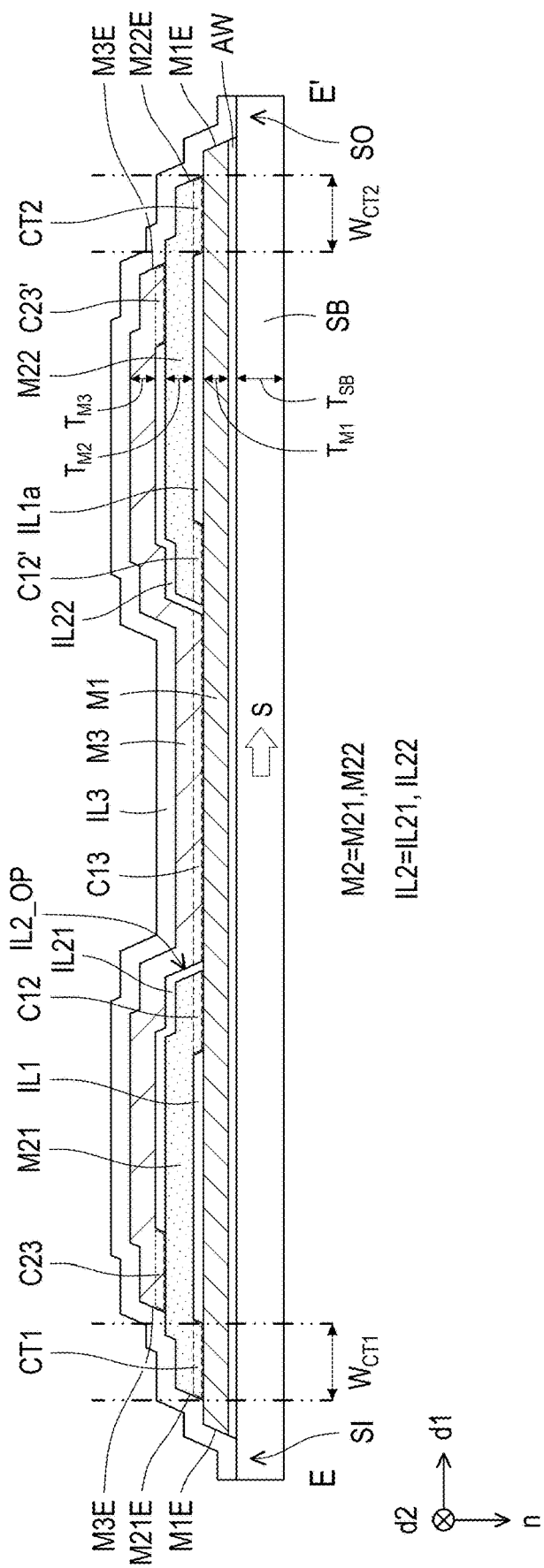
FIG. 5B is a schematic cross-sectional view taken according to section line E-E' of FIG. 5A.

FIG. 5A is a schematic partial top view of an electronic device according to a fifth embodiment of the disclosure, and FIG. 5B is a schematic cross-sectional view taken according to section line E-E' of FIG. 5A. It should be noted that the reference numerals and part of the contents of the embodiment of FIG. 1A and FIG. 1B may remain to be used in the embodiment of FIG. 5A and FIG. 5B, where the same or similar reference numerals are used to refer to the same or similar elements, and the description of the same technical content is omitted.

With reference to FIG. 5A and FIG. 5B together, an electronic device 10e (FIG. 5A) of this embodiment is mainly different from the electronic device 10a of FIG. 1A in (1) the metal pattern M2 (FIG. 5B) in the electronic device 10e includes a metal pattern M21 and a metal pattern M22; (2) the electronic device 10e further includes an insulating pattern IL1a (FIG. 5B), a metal pattern M3, and an insulating pattern IL3 FIG. 5B).

In this embodiment, the metal pattern M2 (FIG. 5B) in the electronic device 10e includes the metal pattern M21 and the metal pattern M22 separated from and adjacent to each other in the first direction d1. Moreover, the electronic device 10e further includes the insulating pattern IL1a (FIG. 5B). The insulating pattern IL1a and the insulating pattern IL1 (FIG. 5B) are separated from and adjacent to each other in the first direction d1. For example, the metal pattern M21 is disposed on the insulating pattern IL1 and covers the insulating pattern IL1, and the metal pattern M22 is disposed on the insulating pattern IL1a and covers the insulating pattern IL1a.

Therefore, the metal pattern M21 may include the contact portion CT1 and the contact portion C12 in contact with the metal pattern M1, and the metal pattern M22 may include the contact portion CT2 and the contact portion C12' in contact with the metal pattern M1. In addition, in this embodiment, an edge M21E of the metal pattern M21 is recessed from the edge M1E of the metal pattern M1 and an edge M22E of the metal pattern M22 is recessed from the edge M1E of the metal pattern M1 in the cross-sectional view, but the disclosure is not limited thereto.

In this embodiment, the insulating pattern IL2 is disposed on the metal pattern M2 and exposes part of the metal pattern M1. To be specific, for example, the insulating pattern IL2 includes an opening IL2_OP, and the opening IL2_OP exposes part of the metal pattern M1. In the cross-sectional view in this embodiment, the insulating pattern IL2 includes an insulating pattern IL21 (FIG. 5B) and an insulating pattern IL22 (FIG. 5B) adjacent to each other in the first direction d1, but the disclosure is not limited thereto. In the top view direction (i.e., viewed from the normal direction n of the substrate SB (FIG. 5B)) in this embodiment, the insulating pattern IL21 and the insulating pattern IL22 may substantially form a rectangular shape, for example, and the insulating pattern IL2 exposes the metal pattern M1 in the rectangular shape, but the disclosure is not limited thereto. For example, the insulating pattern IL21 is disposed on the metal pattern M21, and the insulating pattern IL22 is disposed on the metal pattern M22. In this embodiment, the parts exposed by the insulating pattern IL21 and the insulating pattern IL22 each include part of the metal pattern M2. The metal pattern M3 includes a contact portion C23 and a contact portion C23', and the contact portion C23 and the contact portion C23' are in contact with the metal pattern M2. Moreover, the parts covered by the insulating pattern IL21 and the insulating pattern IL22 respectively include parts of the contact portion C12 and the contact portion C12', but the disclosure is not limited thereto. In addition, in this embodiment, the insulating pattern IL2 also exposes part of the metal pattern M2.

In this embodiment, the metal pattern M3 is disposed on the insulating pattern IL2. The material of the metal pattern M3 may be the same as or different from the material of the metal pattern M1 and the metal pattern M2, and the disclosure is not limited thereto. In some embodiments, in the cross-sectional view, a thickness $T_{M3}$ (FIG. 5B) of the metal pattern M3 may be 0.1 μm to 1 μm (0.1 μm<$T_{M3}$<1 μm). For example, the thickness $T_{M3}$ of the metal pattern M3 is measured from the normal direction n of the substrate SB (FIG. 5B). For example, the thickness $T_{M3}$ may be the thickness of the metal pattern M3 above the insulating pattern IL2 in the normal direction n, but the disclosure is not limited thereto. In some embodiments, the metal pattern M3 together with the metal pattern M1 and the metal pattern M2 may serve to reduce penetration of the signal S (FIG. 5B) into the substrate SB. The principle is as described above and will not be repeatedly described here. In other words, the metal pattern M3 has a skin depth, and the thickness $T_{M3}$ of the metal pattern M3 in the cross-sectional view is greater than or equal to the skin depth of the metal pattern M3.

For example, the metal pattern M3 may be in contact with the metal pattern M1 and/or the metal pattern M2. In this embodiment, the metal pattern M3 may be in contact with both the metal pattern M1 and the metal pattern M2, but the disclosure is not limited thereto. In other embodiments, the metal pattern M3 is in contact with the metal pattern M1 or the metal pattern M2. To be specific, the metal pattern M3 includes a contact portion C13, and the contact portion C13 is in contact with the metal pattern M1 exposed by the insulating pattern IL2. Moreover, the metal pattern M3 further includes the contact portion C23 and the contact portion C23', and the contact portion C23 and the contact portion C23' are in contact with the metal pattern M2 exposed by the insulating pattern IL2. However, the disclosure is not limited thereto. In addition, an edge M3E of the metal pattern M3 is recessed from the edge M2E of the metal pattern M2 in the cross-sectional view. In other words, the two edges M3E of the metal pattern M3 are respectively recessed from the edge M21E of the metal pattern M21 and the edge M22E of the metal pattern M22, but the disclosure is not limited thereto.

The embodiment of the electronic device 10e shows that the edge M3E of the metal pattern M3 is recessed from the edge M2E of the metal pattern M2. However, the disclosure is not limited to this embodiment. For example, in other embodiments, the edge M3E of the metal pattern M3 may exceed the edge M2E of the metal pattern M2 in the first direction d1. Alternatively, the edge M3E of the metal pattern M3 may be aligned with the edge M2E of the metal pattern M2 in the first direction d1. In addition, as described in the embodiments above, the disclosure does not limit the edges of the metal pattern M3 and the edges of the metal pattern M2 to a relationship of being both recessed, exceeded, or aligned.

In addition, although the embodiment of the electronic device 10e shows that the metal pattern M3 is in contact with both the metal pattern M1 and the metal pattern M2, the disclosure is not limited to this embodiment. For example, in other embodiments, it is possible that the metal pattern M3 is not in contact with the metal pattern M1 and is instead electrically connected to the metal pattern M1 through the metal pattern M2 (or the metal pattern M3 is not in contact with the metal pattern M2 and is instead electrically connected to the metal pattern M2 through the metal pattern M1).

In addition, although the electronic device 10e shows that insulating layers are disposed between two of the overlapping parts of the metal pattern M1, the metal pattern M2, and the metal pattern M3 in the cross-sectional view, the disclosure is not limited thereto. In other words, in other embodiments, it is possible that no insulating layers are disposed between any two of the overlapping parts of the metal pattern M1, the metal pattern M2, and the metal pattern M3.

Figure 6A:
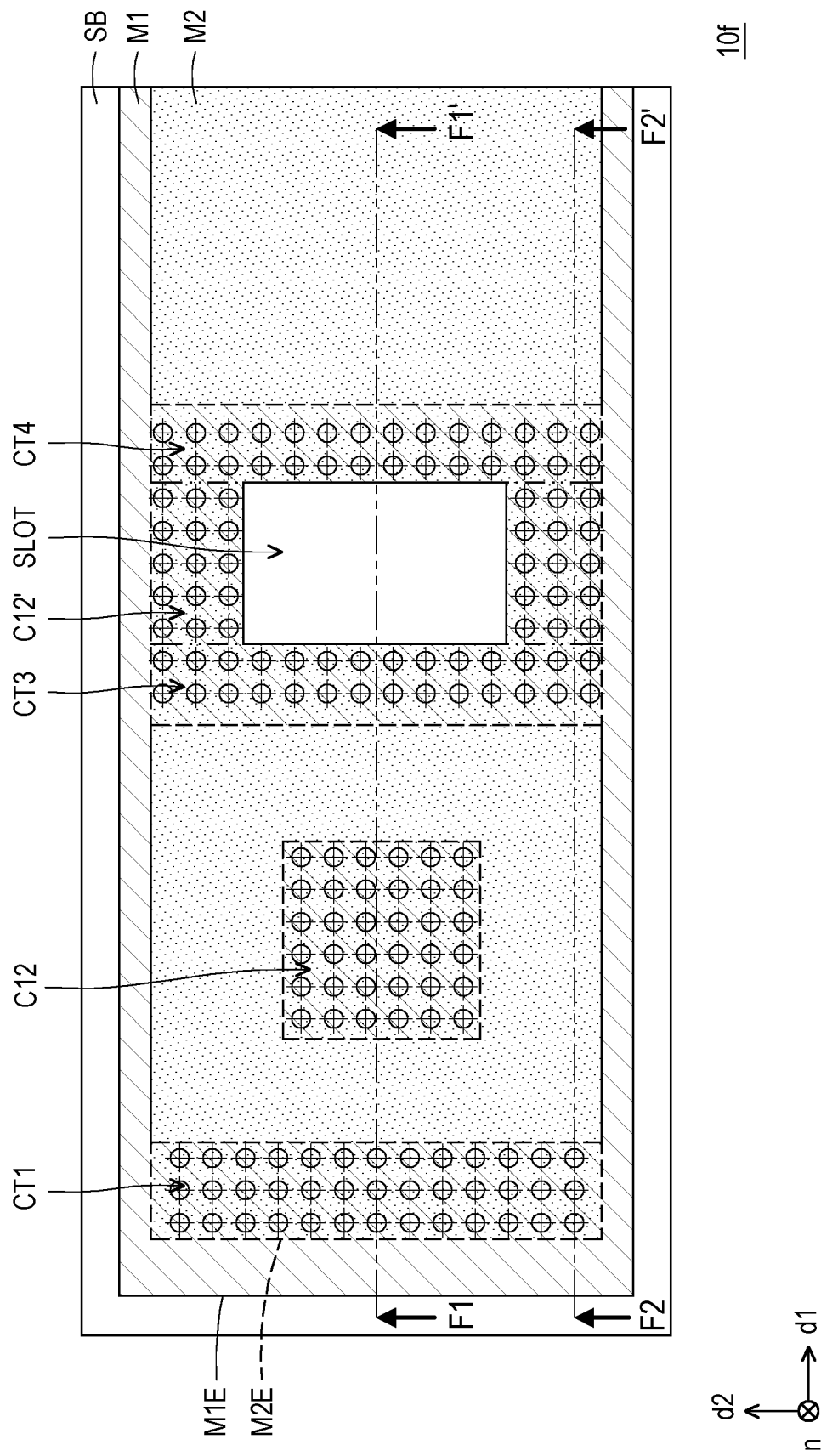
FIG. 6A is a schematic partial top view of an electronic device according to a sixth embodiment of the disclosure.
Figure 6B:
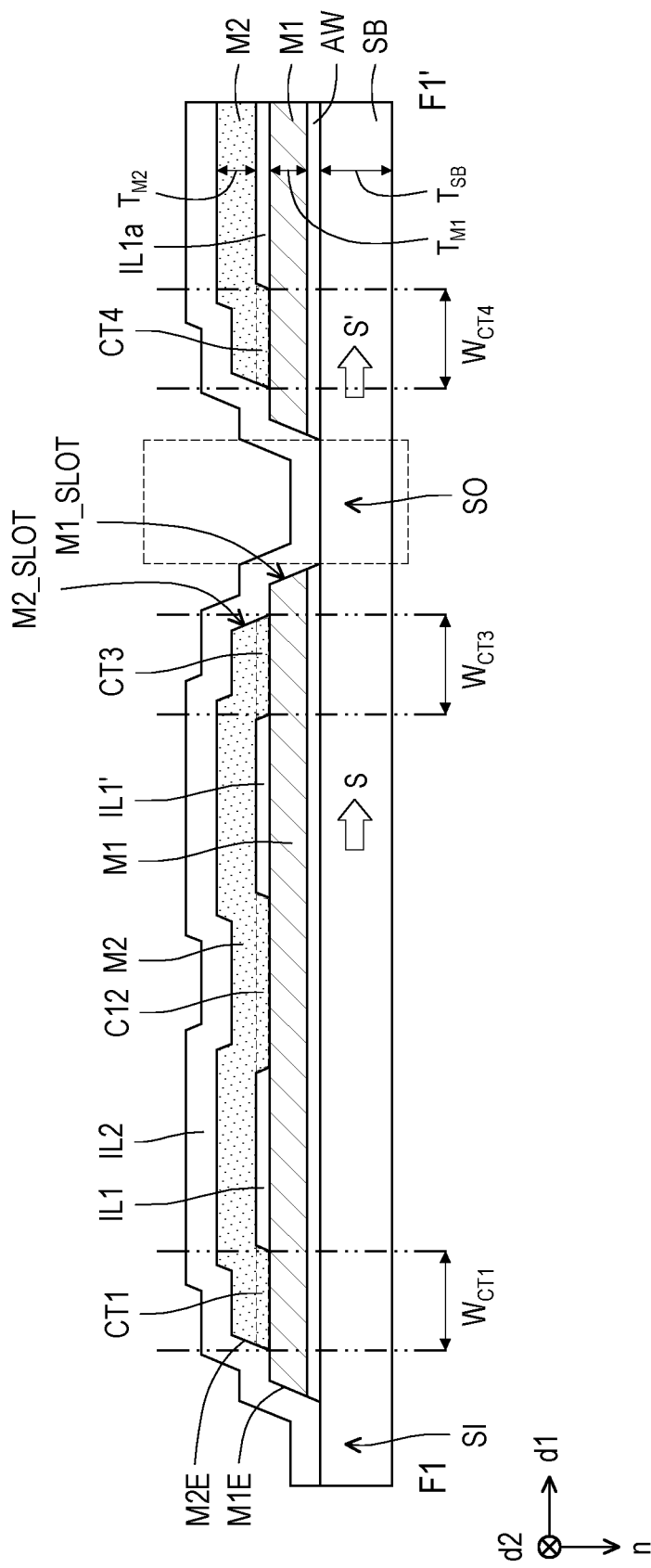
FIG. 6B is a schematic cross-sectional view taken according to section line F1-F1' of FIG. 6A.
Figure 6C:
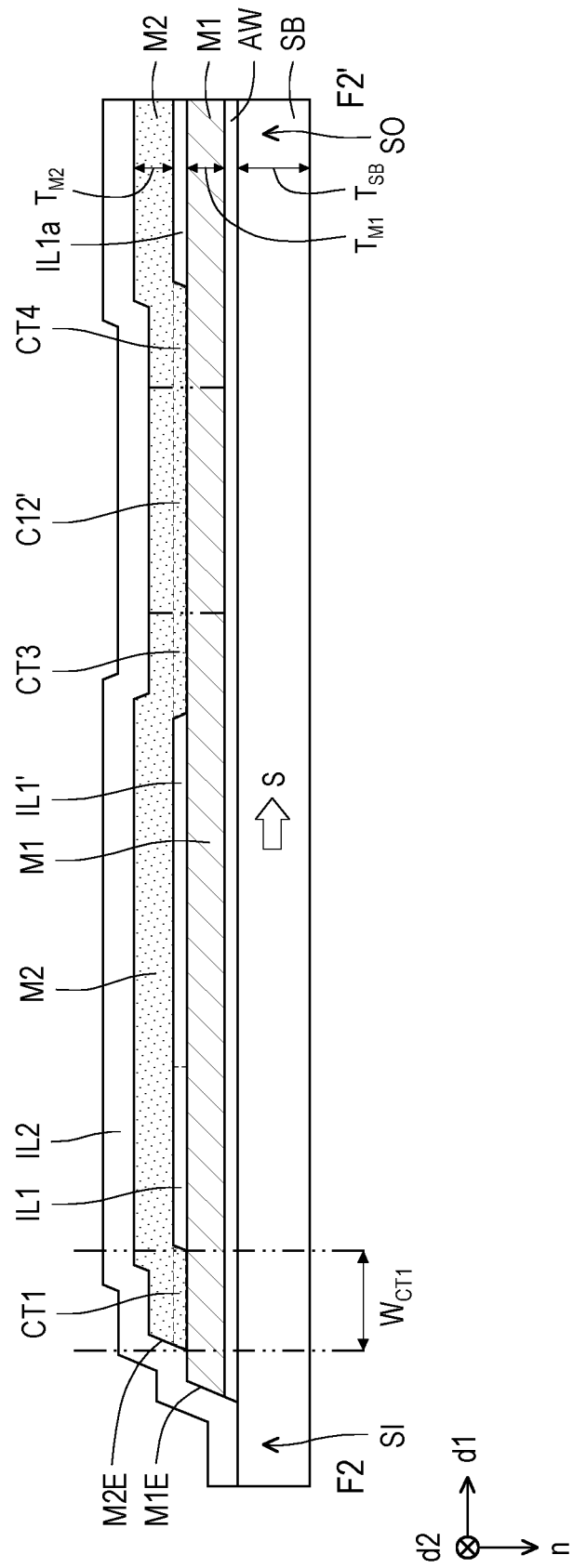
FIG. 6C is a schematic cross-sectional view taken according to section line F2-F2' of FIG. 6A.

FIG. 6A is a schematic partial top view of an electronic device according to a sixth embodiment of the disclosure, FIG. 6B is a schematic cross-sectional view taken according to section line F1-F1' of FIG. 6A, and FIG. 6C is a schematic cross-sectional view taken according to section line F2-F2' of FIG. 6A. It should be noted that the reference numerals and part of the contents of the embodiment of FIG. 4A and FIG. 4B may remain to be used in the embodiment of FIG. 6A to FIG. 6C, where the same or similar reference numerals are used to refer to the same or similar elements, and the description of the same technical content is omitted.

With reference to FIG. 6A to FIG. 6C together, an electronic device 10f (FIG. 6A) of this embodiment is mainly different from the electronic device 10d of FIG. 5A in (1) in the electronic device 10f, the metal pattern M1 includes a slot M1_SLOT (FIG. 6B) in the normal direction n of the substrate SB, and the metal pattern M2 includes a slot M2_SLOT (FIG. 6B) in the normal direction n of the substrate SB; (2) the electronic device 10f further includes the insulating pattern IL1a (FIG. 6B and FIG. 6C).

In this embodiment, the metal pattern M1 includes the slot M1_SLOT in the normal direction n of the substrate SB, and the metal pattern M2 includes the slot M2_SLOT in the normal direction n of the substrate SB. The slot M1_SLOT and the slot M2_SLOT communicate with each other and form a slot SLOT (FIG. 6A and FIG. 6B). Therefore, no metal patterns are disposed in the communicated slot SLOT, so that the signal S (FIG. 6B) may be output from the communicated slot SLOT. In other words, the slot SLOT is the signal output terminal SO (FIG. 6B). To reduce a condition of the signal S not being output from the communicated slot SLOT, a width $W_{CT3}$ (FIG. 6B) of a contact portion CT3 of the metal pattern M2 adjacent to the signal output terminal SO in the first direction d1 (the direction in which the signal S is transmitted) is greater than or equal to a greater one of the skin depth of the metal pattern M1 and the skin depth of the metal pattern M2. The contact portion CT3 is in contact with the metal pattern M1. In this embodiment, the metal pattern M2 may further include a contact portion CT4 adjacent to the signal output terminal SO. A width $W_{CT4}$ (FIG. 6B) of the contact portion CT4 in the first direction d1 is also greater than or equal to the greater one of the skin depth of the metal pattern M1 and the skin depth of the metal pattern M2 to reduce penetration of a remaining signal S' (FIG. 6B) that is not output through the signal output terminal SO into the substrate SB. The contact portion CT4 is in contact with the metal pattern M1. According to the skin effect, the strength of the alternating electromagnetic field (e.g., generated by the signal S) in the contact portion CT3 and the contact portion CT4 decreases exponentially along with not only the depths but also the widths into the contact portion CT3 and the contact portion CT4. Based on the skin effect, when the width $W_{CT3}$ of the contact portion CT3 and the width $W_{CT4}$ of the contact portion CT4 in the first direction d1 are greater than or equal to the greater one of the skin depth of the metal pattern M1 and the skin depth of the metal pattern M2, it is possible to reduce penetration of the signal S from the contact portion CT3 into the substrate SB and/or penetration of the remaining signal S' from the contact portion CT4 into the substrate SB.

In this embodiment, the electronic device 10f further includes the insulating pattern IL1a (FIG. 6B and FIG. 6C). For example, the insulating pattern IL1a is disposed on the metal pattern M1, and is separated from the insulating pattern IL1 (FIG. 6B and FIG. 6C) and the insulating pattern IL1' (FIG. 6B and FIG. 6C) in the first direction d1. In some embodiments, the insulating pattern IL1, the insulating pattern IL1', and the insulating pattern IL1a are sequentially arranged along the first direction d1, but the disclosure is not limited thereto. In this embodiment, the metal pattern M2 covers the insulating pattern IL1a in the normal direction n of the substrate SB.

In summary of the foregoing, in the electronic device of some embodiments of the disclosure, the metal layer is divided into at least two metal patterns in the cross-sectional view, and insulating patterns in contact with metal patterns are disposed between any two metal patterns. Through the above design, warpage generated in the substrate may be reduced without increasing the thickness of the substrate. Furthermore, in the electronic device of other embodiments of the disclosure, by the metal patterns each having a thickness greater than the skin depth of any metal pattern, it is possible to reduce penetration of the signal into the substrate and reduce the loss of the signal during transmission in the substrate. In addition, in the electronic device of still other embodiments of the disclosure, by two metal patterns located at the input terminal of the signal and the output terminal of the signal and in contact with each other having widths in the direction of signal transmission greater than the respective skin depths of the metal patterns, it is also possible to reduce penetration of the signal into the substrate and reduce the loss of the signal during transmission in the substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
   a substrate;
   a first metal pattern disposed on the substrate;
   a first insulating pattern disposed on the first metal pattern;
   a second insulating pattern, wherein in a cross-sectional view, the second insulating pattern is disposed on the first metal pattern and is adjacent to the first insulating pattern; and
   a second metal pattern comprising a first contact portion, a second contact portion and a third contact portion, and disposed on the first metal pattern, the first insulating pattern and the second insulating pattern,
   wherein in the cross-sectional view, the first contact portion and the second contact portion are in contact with the first metal pattern, and the first insulating pattern is in contact with the first metal pattern and the second metal pattern between the first contact portion and the second contact portion,
   wherein the third contact portion is located between the first insulating pattern and the second insulating pattern in the cross-sectional view.

2. The electronic device according to claim 1, wherein the first metal pattern has a first skin depth and the second metal pattern has a second skin depth, and wherein a thickness of the first metal pattern is greater than or equal to the first skin depth and a thickness of the second metal pattern is greater than or equal to the second skin depth in the cross-sectional view.

3. The electronic device according to claim 2, wherein a width of the first contact portion in a first direction and a width of the second contact portion in the first direction are greater than or equal to a greater one of the first skin depth and the second skin depth.

4. The electronic device according to claim 1, wherein an edge of the second metal pattern is recessed from an edge of the first metal pattern in the cross-sectional view.

5. The electronic device according to claim 1, wherein an edge of the second metal pattern is aligned with an edge of the first metal pattern in the cross-sectional view.

6. The electronic device according to claim 1, wherein an edge of the second metal pattern exceeds an edge of the first metal pattern in the cross-sectional view.

7. The electronic device according to claim 1, further comprising:
- a third insulating pattern disposed on the second metal pattern; and
- a third metal pattern disposed on the third insulating pattern.

8. The electronic device according to claim 7, wherein the third metal pattern has a third thickness greater than or equal to a third skin depth of the third metal pattern.

9. The electronic device according to claim 7, wherein the third metal pattern is in contact with at least one of the first metal pattern and the second metal pattern.

10. The electronic device according to claim 1, wherein the second insulating pattern is in contact with the first metal pattern and the second metal pattern between the first contact portion and the second contact portion in the cross-sectional view.

11. An electronic device comprising:
- a substrate;
- a first metal pattern disposed on the substrate;
- a first insulating pattern disposed on the first metal pattern; and
- a second metal pattern comprising a first contact portion and a second contact portion, and disposed on the first metal pattern and the first insulating pattern,
- wherein in a cross-sectional view, the first contact portion and the second contact portion are in contact with the first metal pattern, and the first insulating pattern is in contact with the first metal pattern and the second metal pattern between the first contact portion and the second contact portion,
- wherein in the cross-sectional view, an edge of the second metal pattern is recessed from an edge of the first metal pattern or exceeds the edge of the first metal pattern.

12. An electronic device comprising:
- a substrate;
- a first metal pattern disposed on the substrate and having a first skin depth; and
- a second metal pattern comprising a first contact portion and a second contact portion, disposed on the first metal pattern and having a second skin depth,
- wherein in a cross-sectional view, the first contact portion and the second contact portion are in contact with the first metal pattern, and at least one of a width of the first contact portion in a first direction and a width of the second contact portion in a first direction is greater than or equal to a greater one of the first skin depth and the second skin depth.

13. The electronic device according to claim 12, further comprising:
- a third insulating pattern disposed on the second metal pattern; and
- a third metal pattern disposed on the third insulating pattern.

14. The electronic device according to claim 13, wherein the third metal pattern has a third thickness greater than or equal to a third skin depth of the third metal pattern.

15. The electronic device according to claim 12, further comprising a first insulating pattern, wherein in the cross-sectional view, the first pattern is disposed between the first metal pattern and the second metal pattern, and the first insulating pattern is in contact with the first metal pattern and the second metal pattern between the first contact portion and the second contact portion.

16. The electronic device according to claim 12, wherein an edge of the second metal pattern is recessed from an edge of the first metal pattern in the cross-sectional view.

17. The electronic device according to claim 12, wherein an edge of the second metal pattern is aligned with an edge of the first metal pattern in the cross-sectional view.

18. The electronic device according to claim 12, wherein an edge of the second metal pattern exceeds an edge of the first metal pattern in the cross-sectional view.

19. The electronic device according to claim 12, wherein the first metal pattern has a first thickness greater than or equal to the first skin depth, and the second metal pattern has a second thickness greater than or equal to the second skin depth in the cross-sectional view.

* * * * *